(12) United States Patent
Kim et al.

(10) Patent No.: US 10,896,646 B2
(45) Date of Patent: Jan. 19, 2021

(54) ELECTROLUMINESCENT DISPLAY APPARATUS

(71) Applicant: LG Display Co., Ltd., Seoul (KR)

(72) Inventors: Jiyun Kim, Paju-si (KR); Jung-Min Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 46 days.

(21) Appl. No.: 16/436,304

(22) Filed: Jun. 10, 2019

(65) Prior Publication Data
US 2020/0211473 A1 Jul. 2, 2020

(30) Foreign Application Priority Data

Dec. 27, 2018 (KR) .................... 10-2018-0170883

(51) Int. Cl.
| | |
|---|---|
| *G09G 3/3291* | (2016.01) |
| *G09G 3/3266* | (2016.01) |
| *H01L 27/32* | (2006.01) |

(52) U.S. Cl.
CPC ......... *G09G 3/3291* (2013.01); *G09G 3/3266* (2013.01); *H01L 27/3246* (2013.01); *H01L 27/3262* (2013.01); *H01L 27/3265* (2013.01); *H01L 27/3276* (2013.01)

(58) Field of Classification Search
CPC .......... G09G 3/3291; G09G 3/3266; H01L 27/3276; H01L 27/3262; H01L 27/3265; H01L 27/3246; H01L 27/322; H01L 27/3209; H01L 27/3272; H01L 27/3216; H01L 27/3218
See application file for complete search history.

(56) References Cited

U.S. PATENT DOCUMENTS

| | | | | |
|---|---|---|---|---|
| 2017/0155078 A1* | 6/2017 | Lee | ..................... | H01L 27/3258 |
| 2017/0250367 A1* | 8/2017 | Yasukawa | ........... | H01L 51/5253 |
| 2017/0317154 A1* | 11/2017 | Heo | ..................... | H01L 27/3262 |
| 2017/0317155 A1* | 11/2017 | Oh | ..................... | H01L 27/1255 |
| 2018/0090547 A1* | 3/2018 | Shin | ..................... | G09G 3/3208 |
| 2018/0107316 A1* | 4/2018 | Hanari | ................. | G06F 3/0412 |

FOREIGN PATENT DOCUMENTS

KR    10-2018-0074164 A    7/2018

* cited by examiner

*Primary Examiner* — Andrew Sasinowski
(74) *Attorney, Agent, or Firm* — Fenwick & West LLP (57) ABSTRACT

An electroluminescent display apparatus includes a plurality of unit circuits, each of the plurality of unit circuits including a connection electrode and a driving thin film transistor (TFT), the connection electrode of each of the plurality of unit circuits electrically connected to a gate electrode of the driving TFT included in the unit circuit, a plurality of anode electrodes, each of the plurality of anode electrodes connected to the driving TFT of a corresponding unit circuit, a bank covering an edge of each of the plurality of anode electrodes, the bank defining an emission area for each anode electrode, a light emitting layer on each of the plurality of anode electrodes, and a cathode electrode on the light emitting layer. Each of the plurality of anode electrodes overlaps the gate electrode of the driving TFT and the connection electrode of a corresponding one of the plurality of unit circuits.

23 Claims, 7 Drawing Sheets

ELECTROLUMINESCENT DISPLAY APPARATUS

CROSS-REFERENCE TO RELATED APPLICATIONS

This application claims priority to Republic of Korea Patent Application No. 10-2018-0170883 filed on Dec. 27, 2018, which is hereby incorporated by reference in its entirety.

BACKGROUND

Field of the Invention

The present disclosure relates to an electroluminescent display apparatus.

Discussion of the Related Art

Electroluminescent display apparatuses are apparatuses where a light emitting layer is provided between two electrodes (i.e., an anode electrode and a cathode electrode) and emits light with an electric field generated between the two electrodes, thereby displaying an image.

In the electroluminescent display apparatuses, a plurality of signal lines and a plurality of thin film transistors (TFTs) are provided in each subpixel, for applying a certain signal to the anode electrode or the cathode electrode.

As described above, in the electroluminescent display apparatuses, since the plurality of signal lines and the plurality of TFTs are provided in each subpixel, various parasitic capacitances occur between electrodes configuring the plurality of TFTs or the plurality of signal lines, and due to the parasitic capacitances, a luminance deviation occurs in each subpixel.

SUMMARY

Accordingly, the present disclosure is directed to providing an electroluminescent display apparatus that substantially obviates one or more problems due to limitations and disadvantages of the related art.

An aspect of the present disclosure is directed to providing an electroluminescent display apparatus which decreases a luminance deviation of each subpixel caused by a parasitic capacitance.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an electroluminescent display apparatus including a plurality of unit circuits, each of the plurality of unit circuits including a connection electrode and a driving thin film transistor (TFT). The connection electrode is electrically connected to a gate electrode of the driving TFT. The electroluminescent display includes a plurality of anode electrodes, each of the plurality of anode electrodes connected to the driving TFT of a corresponding unit circuit of the plurality of unit circuits, a bank covering an edge of each of the plurality of anode electrodes, the bank defining an emission area for each anode electrode, a light emitting layer on each of the plurality of anode electrodes, and a cathode electrode on the light emitting layer. Each of the plurality of anode electrodes overlaps the gate electrode of the driving TFT and the connection electrode of a corresponding one of the plurality of unit circuits.

In another aspect of the present disclosure, there is provided an electroluminescent display apparatus including a first unit circuit including a first driving TFT and a second unit circuit including a including a second driving TFT, a first anode electrode electrically connected to the first driving TFT of the first unit circuit, a second anode electrode electrically connected to the second driving TFT of the second unit circuit, a bank covering an edge of the first anode electrode and an edge of the second anode electrode, the bank defining a first emission area of the first anode electrode and a second emission are of the second anode electrode, a light emitting layer on the one first electrode and the second anode electrode, and a cathode electrode on the light emitting layer. The first anode electrode and the first emission area overlap the first unit circuit and the second unit circuit, and the first anode electrode overlaps a gate electrode of the first driving TFT of the first unit circuit, but does not overlap a gate electrode of the second driving TFT of the second unit circuit.

In another aspect of the present disclosure, there is provided an electroluminescent display apparatus including a first anode electrode provided in a first subpixel and a second anode electrode provided in a second subpixel, a bank covering an edge of the first anode electrode and an edge of the second anode electrode, the bank defining a first emission area of the first anode electrode and a second emission area of the of the second anode electrode, a light emitting layer on the first anode electrode and the second anode electrode, and a cathode electrode on the light emitting layer. The first anode electrode has a shape corresponding to the first emission area, and the second anode electrode has a shape that does not correspond to the second emission area.

In another embodiment, an electroluminescent display apparatus includes a substrate, a driving thin film transistor (TFT) on the substrate, the driving TFT including a gate electrode, a connection electrode electrically connected to the gate electrode of the driving TFT, an anode electrode on the driving TFT, a light emitting layer on the anode electrode, and a cathode on the light emitting layer. The connection electrode electrically connects the gate electrode of the driving TFT to a drain electrode of another TFT. The anode electrode overlaps both the gate electrode of the driving TFT and the connection electrode.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~' a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of the present disclosure will be described in detail with reference to the accompanying drawings.

Figure 1:
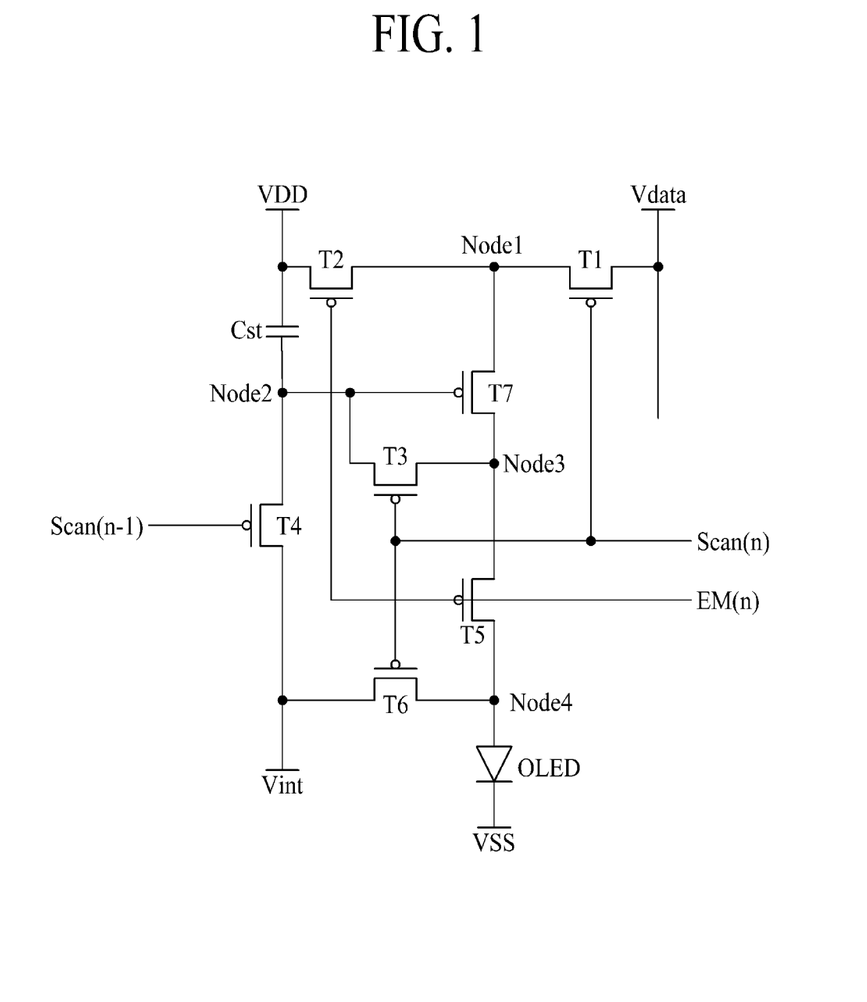
FIG. 1 is a schematic unit circuit diagram of an electroluminescent display apparatus according to an embodiment of the present disclosure.

FIG. 1 is a schematic unit circuit diagram of an electroluminescent display apparatus according to an embodiment of the present disclosure.

As illustrated in FIG. 1, the electroluminescent display apparatus according to an embodiment of the present disclosure may include a plurality of signal lines, a plurality of thin film transistors (TFTs), a storage capacitor Cst, and an organic light emitting device OLED.

The plurality of signal lines may include a scan line Scan(n), a previous scan line Scan(n−1), an emission line EM, an initialization line Vint, a high power line VDD, a low power line VSS, and a data line Vdata.

The scan line Scan(n) may transfer a scan signal to a first TFT T1, a third TFT T3, and a sixth TFT T6. The previous scan line Scan(n-1) may transfer a previous scan signal to a fourth TFT T4. The emission line EM may transfer an emission control signal to a second TFT T2 and a fifth TFT T5. The initialization line Vint may transfer an initialization voltage for initializing a seventh TFT T7, the high power line VDD may transfer a driving voltage to the seventh TFT T7, and the low power line VSS may transfer a low voltage to a cathode electrode of the organic light emitting device OLED. The data line Vdata may transfer a data voltage to the first TFT T1.

The plurality of TFTs may include the first TFT Ti, the second TFT T2, the third TFT T3, the fourth TFT T4, the fifth TFT T5, the sixth TFT T6, and the seventh TFT T7.

The first TFT T1 may be a switching TFT. A gate electrode of the first TFT T1 may be connected to the scan line Scan(n), a source electrode of the first TFT T1 may be connected to the data line Vdata, and a drain electrode of the first TFT T1 may be connected to a source electrode of the seventh TFT T7 and a drain electrode of the second TFT T2 through a first node Node1. The first TFT T1 may be turned on based on the scan signal transferred through the scan line Scan(n) and may perform a switching operation of transferring the data signal, transferred through the data line Vdata, to the source electrode of the seventh TFT T7 which is a driving TFT.

The second TFT T2 may be an operation control TFT. A gate electrode of the second TFT T2 may be connected to the emission line EM, a source electrode of the second TFT T2 may be connected to the high power line VDD, and the drain electrode of the second TFT T2 may be connected to the source electrode of the seventh TFT T7 and the drain electrode of the first TFT T1 through the first node Node1.

The third TFT T3 may be a compensation TFT. A gate electrode of the third TFT T3 may be connected to the scan line Scan(n), a source electrode of the third TFT T3 may be connected to a drain electrode of the seventh TFT T7 through a third node Node3, and a drain electrode of the third TFT T3 may be connected to a first capacitor electrode of the storage capacitor Cst and a drain electrode of the fourth TFT T4 through a second node Node2 and may be connected to a gate electrode of the seventh TFT T7. The third TFT T3 may be turned on based on the scan signal transferred through the scan line Scan(n) and may electrically connect the gate electrode and the drain electrode of the seventh TFT T7 to diode-connect the seventh TFT T7.

The fourth TFT T4 may be an initialization TFT. A gate electrode of the fourth TFT T4 may be connected to the previous scan line Scan(n-1), a source electrode of the fourth TFT T4 may be connected to a drain electrode of the sixth TFT T6 and the initialization line Vint, and a drain electrode of the fourth TFT T4 may be connected to the first capacitor electrode of the storage capacitor Cst, the drain electrode of the third TFT T3, and the gate electrode of the seventh TFT T7 through the second node Node2. The fourth TFT T4 may be turned on based on a previous scan signal transferred through the previous scan line Scan(n-1) and may transfer the initialization voltage to the gate electrode of the seventh TFT T7 to perform an initialization operation of initializing a voltage at the gate electrode of the seventh TFT T7.

The fifth TFT T5 may be an emission control TFT. A gate electrode of the fifth TFT T5 may be connected to the emission line EM, a source electrode of the fifth TFT T5 may be connected to the drain electrode of the seventh TFT T7 and the source electrode of the third TFT T3 through the third node Node3, and a drain electrode of the fifth TFT T5 may be electrically connected to a source electrode of the sixth TFT T6 and an anode electrode of the organic light emitting device OLED through a fourth node Node4. The second TFT T2 and the fifth TFT T5 may be simultaneously turned on the emission control signal transferred through the emission line EM and may transfer the driving voltage to the organic light emitting device OLED to allow an emission current to flow in the organic light emitting device OLED.

The sixth TFT T6 may be a bypass TFT. A gate electrode of the sixth TFT T6 may be connected to the scan line Scan(n), the source electrode of the sixth TFT T6 may be connected to the drain electrode of the fifth TFT T5 and the anode electrode of the organic light emitting device OLED through the fourth node Node4, and the drain electrode of the sixth TFT T6 may be connected to the initialization line Vint. Even in a case where a minimum current, allowing a black image to be displayed, of the seventh TFT T7 flows as a driving current, when the organic light emitting device OLED emits light, the black image may not normally be displayed. Here, the minimum current of the seventh TFT T7 may denote a current corresponding to a condition where the seventh TFT T7 is turned off when a gate-source voltage VGS of the seventh TFT T7 is lower than a threshold voltage Vth. Therefore, in order to prevent the organic light emitting device OLED from emitting light when the driving current corresponding to the minimum current flows therein, the sixth TFT T6 may disperse, as a bypass current, a portion of a current, flowing out from the seventh TFT T7, to a current path other than a current path toward the organic light emitting device OLED.

The seventh TFT T7 may be a driving TFT. The gate electrode of the seventh TFT T7 may be connected to the first capacitor electrode of the storage capacitor Cst via the second node Node2, the source electrode of the seventh TFT T7 may be connected to the high power line VDD via the second TFT T2, and the drain electrode of the seventh TFT T7 may be electrically connected to the anode electrode of the organic light emitting device OLED via the fifth TFT T5. The seventh TFT T7 may receive the data signal to transfer the emission current to the organic light emitting device OLED, based on a switching operation of the first TFT T1.

The storage capacitor Cst may include the first capacitor electrode connected to the second node Node2 and a second capacitor electrode connected to the high power line VDD.

The organic light emitting device OLED may include the anode electrode connected to the fourth node Node4, the cathode electrode connected to the low power line VSS, and a light emitting layer provided between the anode electrode and the cathode electrode.

Figure 2:
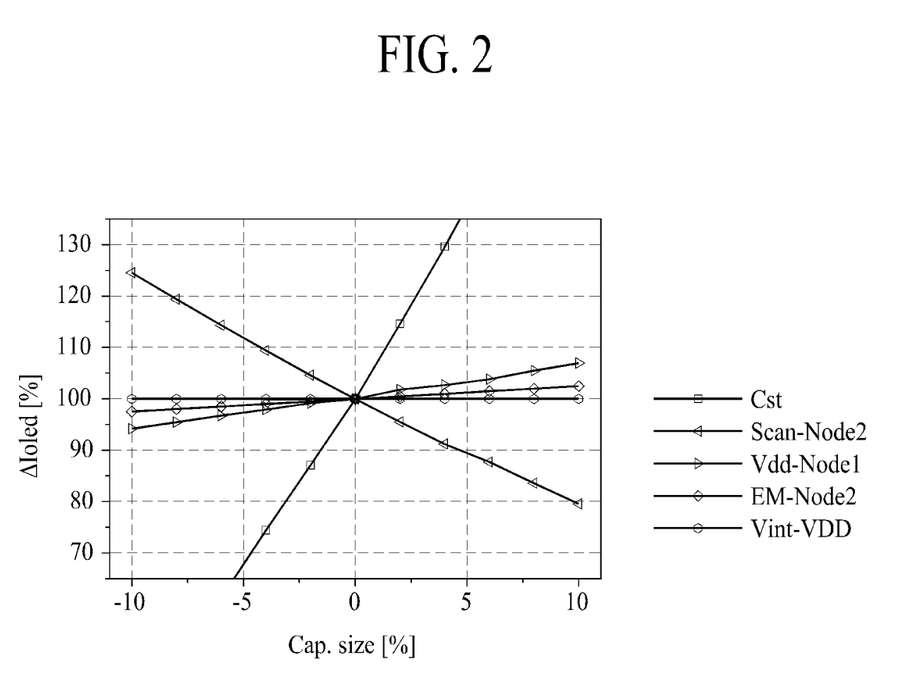
FIG. 2 is a graph showing a variation of an emission current flowing in an organic light emitting device with respect to a variation of a capacitance of each capacitor or a parasitic capacitor.

FIG. 2 is a graph showing a variation of an emission current flowing in an organic light emitting device with respect to a variation of a capacitance of each capacitor or a parasitic capacitor.

In FIG. 2, the horizontal axis of the graph represents a capacitance variation at a node or a capacitor of the circuit of FIG. 1, and the vertical axis of the graph axis represents a variation in the emission current of the OLED of FIG. 1. A curve with a small slope represents a case where the emission current variation is relatively small with respect to the capacitance variation, and a curve with a large slope represents a case where the emission current variation is relatively large with respect to the capacitance variation. That is, in FIG. 2, a capacitor or node with a representative curve which is large in slope may cause a luminance deviation of each subpixel because the emission current variation sensitively reacts to the capacitance variation.

As seen in FIG. 2, a slope of the storage capacitor Cst is largest, a slope of a capacitor between the scan line Scan(n) and the second node Node2 is second largest, a slope of a capacitor between the high power line VDD and the first node Node1 is third largest, a slope of a capacitor between the emission line EM and the second node Node2 is fourth largest, and a slope of a capacitor between the initialization line Vint and the high power line VDD is close to zero.

As seen in FIG. 2, a slope of a capacitor including the second node Node2 is relatively large. Therefore, it may be seen that, when elements overlapping the second node Node2 are not uniformly designed in a plurality of subpixels, a luminance deviation of each subpixel occurs.

The second node Node2 may be connected to the seventh TFT T7 which is a driving TFT. Therefore, in an embodiment of the present disclosure, an overlapping region between the second node Node2 and the anode electrode of the organic light emitting device OLED may be uniformly designed in each subpixel, thereby preventing a luminance deviation of each subpixel. In more detail, in an embodiment of the present disclosure, the anode electrode of the organic light emitting device OLED may be provided to overlap a whole region of a gate electrode of the driving TFT in each subpixel, thereby preventing a luminance deviation of each subpixel.

Figure 3:
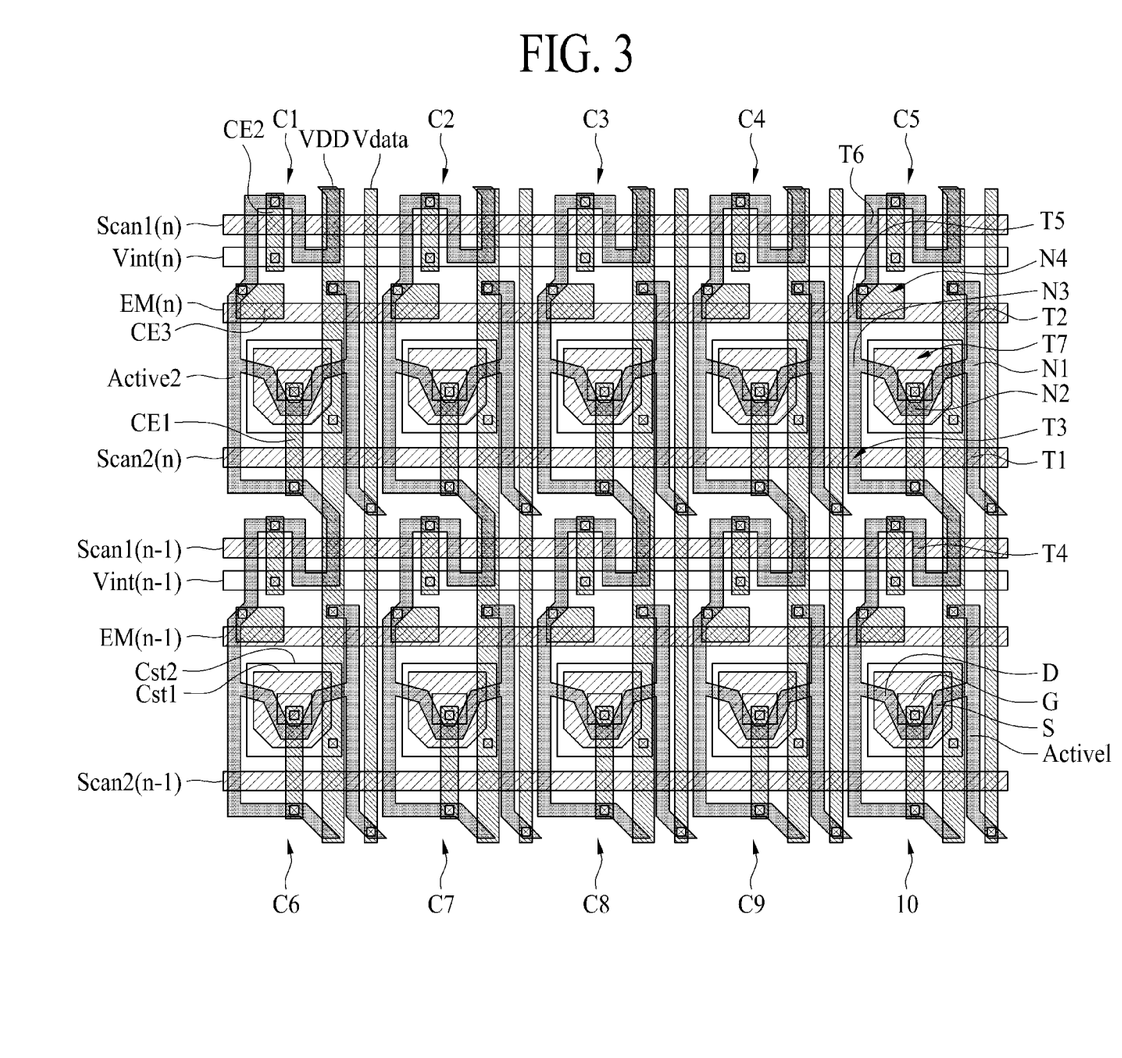
FIG. 3 is a plan view illustrating a configuration of a plurality of unit circuits according to an embodiment of the present disclosure.

FIG. 3 is a plan view illustrating a configuration of a plurality of unit circuits according to an embodiment of the present disclosure. In FIG. 3, total ten unit circuits C1 to C10 of two rows×five columns are illustrated.

As seen in FIG. 3, a first scan line Scan1(n), a second scan line Scan2(n), an initialization line Vint(n), an emission line EM(n), a first previous scan line Scan1(n-1), a second previous scan line Scan2(n-1), a previous initialization line Vint(n-1), and a previous emission line EM(n-1) may be arranged in a widthwise direction. Each of a plurality of subpixels may include two scan lines Scan1(n) and Scan2(n) and two previous scan lines Scan1(n-1) and Scan2(n-1), the first scan line Scan1(n) and the second scan line Scan2(n)

may be connected to each other in a non-display area, and the first previous scan line Scan1(*n*−1) and the second previous scan line Scan2(*n*−1) may also be connected to each other in the non-display area. The first scan line Scan1(*n*), the second scan line Scan2(*n*), the emission line EM(n), the first previous scan line Scan1(*n*−1), the second previous scan line Scan2(*n*−1), and the previous emission line EM(n−1) may be provided on the same layer.

Moreover, in each subpixel, a high power line VDD and a data line Vdata may be arranged in a lengthwise direction. The high power line VDD and the data line Vdata may be provided on the same layer.

Each subpixel may include first to seventh TFTs T1 to T7 and a plurality of storage capacitors Cst1 and Cst2.

The first TFT T1 which is a switching TFT may be provided in a region where the second scan line Scan2(*n*) overlaps a first active layer Active1. With respect to the second scan line Scan2(*n*), one side of the first active layer Active1 may be a source region and the source region may be connected to the data line Vdata through a contact hole, and with respect to the second scan line Scan2(*n*), the other side of the first active layer Active1 may be a drain region and the drain region may be connected to a first node Node1. A source region and a drain region may respectively function as a source electrode and a drain electrode.

The second TFT T2 which is an operation control TFT may be provided in a region where the emission line EM(n) overlaps the first active layer Active1. With respect to the emission line EM(n), one side of the first active layer Active1 may be a source region and the source region may be connected to the high power line VDD through a contact hole, and with respect to the emission line EM(n), the other side of the first active layer Active1 may be a drain region and the drain region may be connected to the first node Node1.

The third TFT T3 which is a compensation TFT may be provided in a region where the second scan line Scan2(*n*) overlaps a second active layer Active2. With respect to the second scan line Scan2(*n*), one side of the second active layer Active2 may be a source region and the source region may be connected to a third node Node3, and with respect to the second scan line Scan2(*n*), the other side of the second active layer Active2 may be a drain region and the drain region may be connected to a first connection electrode CE1 through a contact hole. One end of the first connection electrode CE1 may be connected to the second active layer Active2 through a contact hole, and the other end of the first connection electrode CE1 may be electrically connected to a gate electrode of the seventh TFT T7 through a contact hole. Therefore, a drain region of the third TFT T3 may be electrically connected to the gate electrode of the seventh TFT T7 through the first connection electrode CE1. The first connection electrode CE1 may be provided as the same layer as the high power line VDD and the data line Vdata.

The fourth TFT T4 which is an initialization TFT may be provided in a region where the first previous scan line Scan1(*n*−1) overlaps the second active layer Active2. With respect to the first previous scan line Scan1(*n*−1), one side of the second active layer Active2 may be a source region and the source region may be connected to a second connection electrode CE2 through a contact hole. One end of the second connection electrode CE2 may be connected to the second active layer Active2 through a contact hole, and the other end of the second connection electrode CE2 may be connected to the initialization line Vint through a contact hole. Therefore, a source region of the fourth TFT T4 may be connected to the initialization line Vint through the second connection electrode CE2. The second connection electrode CE2 may be provided as the same layer as the high power line VDD and the data line Vdata. Also, with respect to the first previous scan line Scan1(*n*−1), the other side of the second active layer Active2 may be a drain region and the drain region may be connected to the first connection electrode CE1 through a contact hole. Therefore, a drain region of the fourth TFT T4 may be electrically connected to the gate electrode of the seventh TFT T7 through the first connection electrode CE1.

The fifth TFT T5 which is an emission control TFT may be provided in a region where the emission line EM(n) overlaps the second active layer Active2. With respect to the emission line EM(n), one side of the second active layer Active2 may be a source region and the source region may be connected to a third node Node3, and with respect to the emission line EM(n), the other side of the second active layer Active2 may be a drain region and the drain region may be connected to a fourth node Node4. The fourth node Node4 may be connected to a third connection electrode CE3 through a contact hole. The third connection electrode CE3 may connect the fourth node Node4 to an anode electrode of an organic light emitting device. Therefore, a drain region of the fifth TFT T5 may be electrically connected to the anode electrode of the organic light emitting device through the third connection electrode CE3. The third connection electrode CE3 may be provided as the same layer as the high power line VDD and the data line Vdata.

The sixth TFT T6 which is a bypass TFT may be provided in a region where the first scan line Scan1(*n*) overlaps the second active layer Active2. With respect to the first scan line Scan1(*n*), one side of the second active layer Active2 may be a source region and the source region may be connected to a fourth node Node4. Therefore, a source region of the sixth TFT T6 may be electrically connected to the anode electrode of the organic light emitting device through the third connection electrode CE3. Also, with respect to the first scan line Scan1(*n*), the other side of the second active layer Active2 may be a drain region and the drain region may be connected to the second connection electrode CE2 through a contact hole. Therefore, a drain region of the sixth TFT T6 may be connected to the initialization line Vint through the second connection electrode CE2.

The seventh TFT T7 which is a driving TFT may include a gate electrode G, a source electrode S, and a drain electrode D. The gate electrode G may be connected to the second node Node2, the source electrode S may be connected to the first node Node1, and the drain electrode D may be connected to the third node Node3. The source electrode S may be connected to the high power line VDD via the first node Node1 and the second TFT T2. The drain electrode D may be electrically connected to the anode electrode of the organic light emitting device via the third node Node3, the fifth TFT T5, and the third connection electrode CE3. This may correspond to a case where the seventh TFT T7 is a P-type transistor, and for example, when the seventh TFT T7 is an N-type transistor, the source electrode S may be electrically connected to the anode electrode of the organic light emitting device and the drain electrode D may be connected to the high power line VDD.

The gate electrode G may be connected to each of the first connection electrode CE1 and a first capacitor electrode Cst1 through a contact hole. The first connection electrode CE1 may electrically connect the gate electrode G of the seventh TFT T7 to a drain region of the third TFT T3.

Each of the storage capacitors Cst1 and Cst2 may include the first capacitor electrode Cst1 and a second capacitor electrode Cst2. The first capacitor electrode Cst1 may be connected to the gate electrode G of the seventh TFT T7 through a contact hole, and the second capacitor electrode Cst2 may be connected to the high power line VDD through a contact hole.

As described above, according to an embodiment of the present disclosure, a whole region of the gate electrode G of the seventh TFT T7 which is a driving TFT may overlap the anode electrode of the organic light emitting device in each subpixel, thereby preventing a luminance deviation of each subpixel.

In this case, the gate electrode G of the seventh TFT T7 may be connected to the first connection electrode CE1, and thus, in each subpixel, a whole region of each of the gate electrode G of the seventh TFT T7 and the first connection electrode CE1 may overlap the anode electrode of the organic light emitting device.

Hereinafter, an example where a subpixel-based anode electrode is provided in a plurality of unit circuits according to various embodiments of the present disclosure will be described.

Figure 4:
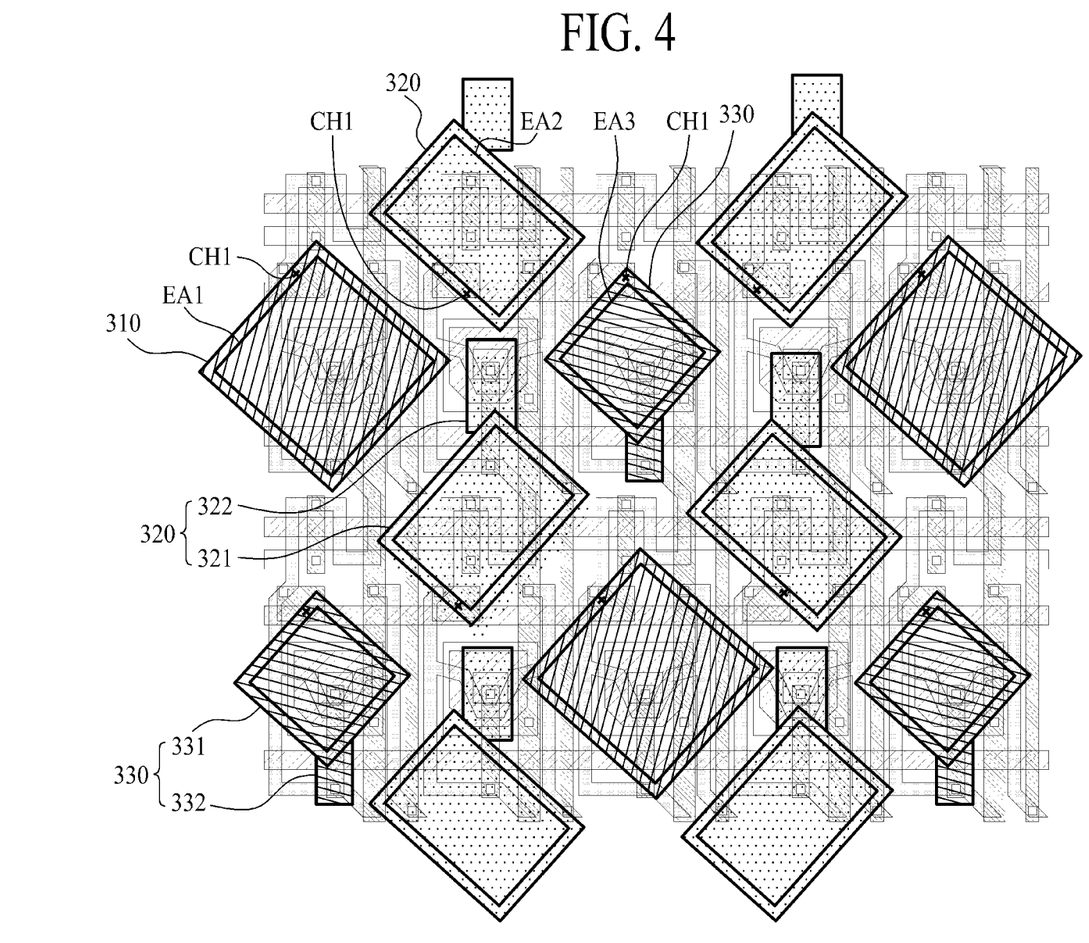
FIG. 4 is a plan view illustrating an example where an anode electrode is provided in each of a plurality of sub-pixels according to an embodiment of the present disclosure.

FIG. 4 is a plan view illustrating an example where an anode electrode is provided in each of a plurality of subpixels according to an embodiment of the present disclosure and illustrates an example where an anode electrode is provided in the plurality of unit circuits described above with reference to FIG. 3.

As seen in FIG. 4, a plurality of first anode electrodes 310, a plurality of second anode electrodes 320, and a plurality of third anode electrodes 330 may be spaced apart from one another by a certain interval in a diagonal direction. One first anode electrode 310 may be surrounded by four second anode electrodes 320 in the diagonal direction, one second anode electrode 320 may be surrounded by two first anode electrodes 310 and two third anode electrodes 330 in the diagonal direction, and one third anode electrode 330 may be surrounded by four second anode electrodes 320 in the diagonal direction.

An edge of each of the first anode electrode 310, the second anode electrode 320, and the third anode electrode 330 may be covered by a bank, and regions which are not covered by the bank and are exposed may be a plurality of emission areas EA1 to EA3. Therefore, an exposure region of the first anode electrode 310 which is not covered by the bank and is exposed may be a first emission area EA1, an exposure region of the second anode electrode 320 which is not covered by the bank and is exposed may be a second emission area EA2, and an exposure region of the third anode electrode 330 which is not covered by the bank and is exposed may be a third emission area EA3.

The first emission area EA1 may be a blue emission area, the second emission area EA2 may be a green emission area, and the third emission area EA3 may be a red emission area. Considering that blue emission efficiency is relatively low, the first emission area EA1 may be provided to be wider than the second emission area EA2 and the third emission area EA3. One side of the second emission area EA2 may face the first emission area EA1, and the other side of the second emission area EA2 may face the third emission area EA3. In this case, a length of the one side of the second emission area EA2 may be the same as that of one side of the first emission area EA1 facing the one side of the second emission area EA2, and a length of the other side of the second emission area EA2 may be the same as that of one side of the third emission area EA3 facing the other side of the second emission area EA2. Therefore, an area of the second emission area EA2 may be greater than that of the third emission area EA3. The first emission area EA1 and the third emission area EA3 may each be provided in a square structure, and the second emission area EA2 may be provided in a rectangular structure.

Due to such an area difference, the first anode electrode 310 and the first emission area EA1 may overlap a plurality of unit circuits, the second anode electrode 320 and the second emission area EA2 may overlap a plurality of unit circuits, and the third anode electrode 330 and the third emission area EA3 may overlap one unit circuit. However, the present embodiment is not limited thereto.

Each of the first anode electrode 310, the second anode electrode 320, and the third anode electrode 330 may be electrically connected to a third connection electrode CE3 of a unit circuit corresponding thereto. For example, one first anode electrode 310 corresponding to a first unit circuit C1 may be electrically connected to a third connection electrode CE3 of the first unit circuit C1 through a first contact hole CH1, one second anode electrode 320 corresponding to a second unit circuit C2 may be electrically connected to a third connection electrode CE3 of the second unit circuit C2 through a first contact hole CH1, and one third anode electrode 330 corresponding to a third unit circuit C3 may be electrically connected to a third connection electrode CE3 of the third unit circuit C3 through a first contact hole CH1. In this case, each of the first anode electrode 310, the second anode electrode 320, and the third anode electrode 330 may overlap a third connection electrode CE3 of a unit circuit (for example, C1, C2, or C3) corresponding thereto.

Due to an arrangement structure of the of the first anode electrode 310, the second anode electrode 320, and the third anode electrode 330, for example, the one first anode electrode 310 corresponding to the first unit circuit C1 may overlap a whole region of each of a first connection electrode CE1 and a gate electrode G of the first unit circuit C1.

On the other hand, the one second anode electrode 320 corresponding to the second unit circuit C2 may not overlap a whole region of each of a first connection electrode CE1 and a gate electrode G of the second unit circuit C2. Therefore, the whole region of each of the first connection electrode CE1 and the gate electrode G of the second unit circuit C2 may overlap another second anode electrode 320 corresponding to a seventh unit circuit C7 thereunder.

To this end, the another second anode electrode 320 may include a first portion 321 and a second portion 322. The first portion 321 may be a portion which overlaps a whole region of the second emission area EA2 and has a shape corresponding to the second emission area EA2, and the second portion 322 may be a portion which protrudes from the first portion 321 and overlaps a whole region of each of the first connection electrode CE1 and the gate electrode G of the second unit circuit C2. The first portion 321 and the second portion 322 may include the same material and may be provided as a single body.

One third anode electrode 330 corresponding to the third unit circuit C3 may include a first portion 331 and a second portion 332, so as to overlap a whole region of each of a first connection electrode CE1 and a gate electrode G of the third unit circuit C3. The first portion 331 may be a portion which overlaps a whole region of the third emission area EA3 and has a shape corresponding to the third emission area EA3, and the second portion 332 may be a portion which protrudes from the first portion 331 and overlaps the first connection electrode CE1 of the third unit circuit C3. The first portion 331 and the second portion 332 may include the same material and may be provided as a single body.

As described above, according to an embodiment of the present disclosure, in each of the plurality of unit circuits C1 to C3, a whole region of each of the first connection electrode CE1 and the gate electrode G of the seventh TFT T7 may overlap the anode electrodes 310 to 330, thereby preventing a luminance deviation of each subpixel.

Figure 5:
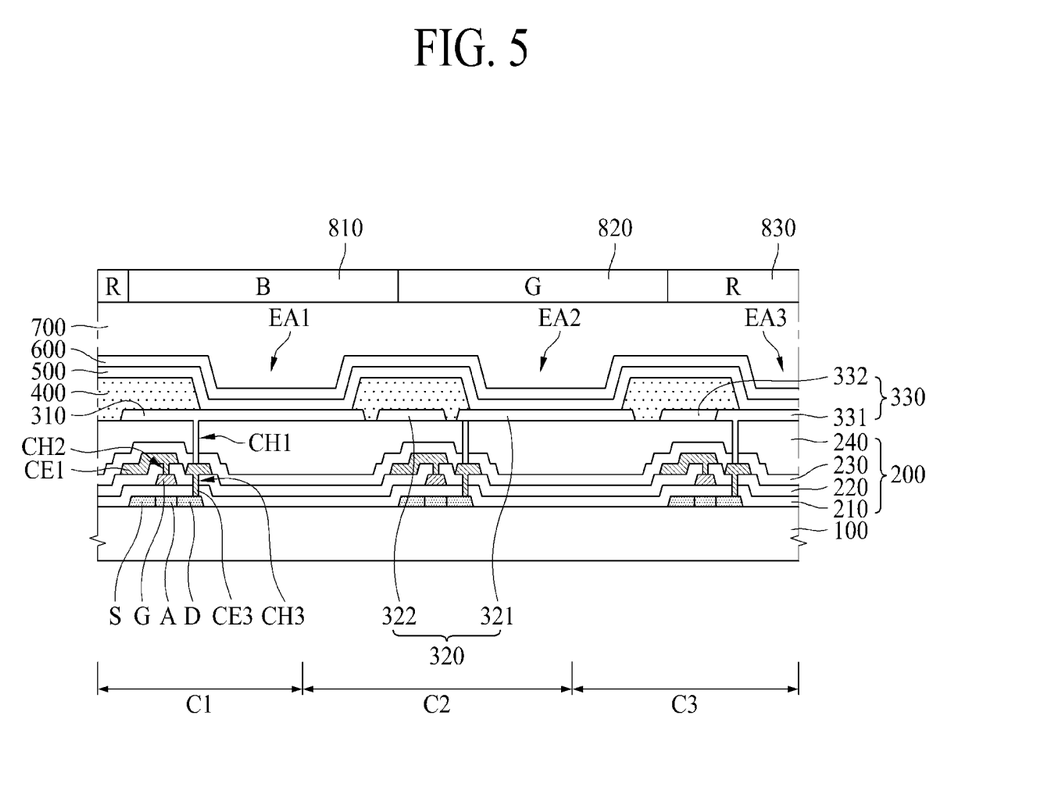
FIG. 5 is a cross-sectional view of an electroluminescent display apparatus according to an embodiment of the present disclosure and is a schematic cross-sectional view of first to third unit circuit regions of FIG. 4.

FIG. 5 is a cross-sectional view of an electroluminescent display apparatus according to an embodiment of the present disclosure and is a schematic cross-sectional view of first to third unit circuit C1 to C3 regions of FIG. 4.

As seen in FIG. 5, the electroluminescent display apparatus according to an embodiment of the present disclosure may include a substrate 100, a circuit device layer 200, a plurality of anode electrodes 310 to 330, a bank 400, a light emitting layer 500, a cathode electrode 600, an encapsulation layer 700, and a plurality of color filter layers 810 to 830.

The substrate 100 may be formed of glass, plastic, and/or the like, but is not limited thereto. The substrate 100 may be formed of a transparent material, or may be formed of an opaque material. The electroluminescence display apparatus according to an embodiment of the present disclosure may be implemented as a top emission type where emitted light travels to an upper portion, and in this case, a material of the substrate 100 may use an opaque material as well as a transparent material.

The circuit device layer 200 may be provided on the substrate 100. A first unit circuit C1, a second unit circuit C2, and a third unit circuit C3 may be provided in the circuit device layer 200, and a plurality of signal lines, a plurality of TFTs, and a storage capacitor may be provided in each of the first to third unit circuits C1 to C3. In the drawing, only a driving TFT is illustrated.

To provide a detailed description, an active layer A, a source electrode S, and a drain electrode D of the driving TFT may be provided in each of the first to third unit circuits C1 to C3 on the substrate 100. The source electrode S may be configured as a source region provided on one side of the active layer A, and the drain electrode D may be configured as a drain region provided on the other side of the active layer A.

A first insulation layer 210 functioning as a gate insulation layer may be provided on the active layer A, the source electrode S, and the drain electrode D, and the gate electrode G of the driving TFT may be provided on the first insulation layer 210.

A second insulation layer 220 which is an interlayer insulation layer may be provided on the gate electrode G, and a first connection electrode CE1 and a third connection electrode CE3 may be provided on the second insulation layer 220. The first connection electrode CE1 may be connected to the gate electrode G through a second contact hole CH2, and the third connection electrode CE3 may be connected to the drain electrode D through a third contact hole CH3.

A third insulation layer 230 which is a passivation layer may be provided on the first connection electrode CE1 and the third connection electrode CE3, and a fourth insulation layer 240 which is a planarization layer may be provided on the third insulation layer 230.

The anode electrodes (for example, first to third anode electrodes) 310 to 330 may be provided on the fourth insulation layer 240.

The first anode electrode 310 may be provided to overlap the first unit circuit C1 and the second unit circuit C2. The first anode electrode 310 may be connected to the third connection node CE3 of the first unit circuit C1 through the first contact hole CH1. Particularly, the first anode electrode 310 may be provided to overlap the first connection node CE1 and the gate electrode G of the first unit circuit C1.

The second anode electrode 320 may be provided to overlap the second unit circuit C2 and the third unit circuit C3. The second anode electrode 320 may be provided in plurality. A first portion 321 of one second anode electrode 320 may be connected to the third connection node CE3 of the second unit circuit C2 through a first contact hole CH1, but may not overlap the first connection node CE1 and the gate electrode G of the second unit circuit C2. On the other hand, a second portion 322 of another second anode electrode 320 may be provided to overlap the first connection node CE1 and the gate electrode G of the second unit circuit C2. The second portion 322 of the another second anode electrode 320 may correspond to the above-described seventh unit pixel C7 of FIG. 4.

The third anode electrode 330 may be provided to overlap the third unit circuit C3. A first portion 331 of the third anode electrode 330 may be connected to the third connection node CE3 of the third unit circuit C3 through a first contact hole CH1, but may not overlap the first connection node CE1 and the gate electrode G of the third unit circuit C3. On the other hand, a second portion 332 of the third anode electrode 330 may be provided to overlap the first connection node CE1 and the gate electrode G of the third unit circuit C3.

The bank 400 may be provided on the fourth insulation layer 240 to cover an edge of each of the anode electrodes 310 to 330. Exposure regions, which are not covered by the bank 400 and are exposed, of the anode electrodes 310 to 330 may respectively configure a plurality of emission areas (for example, first to third emission areas) EA1 to EA3. The second portion of the second anode electrode 320 and the second portion 332 of the third anode electrode 330 may be covered by the bank 400.

The light emitting layer 500 may be provided on the anode electrodes 310 to 330 and the bank 400. That is, the light emitting layer 500 may be configured in a structure connected as one body in the plurality of unit circuits C1 to C3. The light emitting layer 500 may be provided to emit white (W) light. To this end, the light emitting layer 500 may include a plurality of stacks which emit lights of different colors. For example, the light emitting layer 500 may include a first stack emitting blue light, a second stack emitting yellowish green light, and a charge generating layer provided between the first stack and the second stack. Also, the light emitting layer 500 may include a blue light emitting layer, a green light emitting layer, and a red light emitting layer which are patterned apart from one another in the plurality of unit circuits C1 to C3.

The cathode electrode 600 may be provided on the light emitting layer 500. The cathode electrode 600 may be configured in a structure connected as one body in the plurality of unit circuits C1 to C3.

The encapsulation layer 700 may be provided on the cathode electrode 600 and may prevent external water from penetrating into the light emitting layer 500.

The color filter layers 810 to 830 may include a blue (B) color filter 810 overlapping the first emission area EA1, a green (G) color filter 820 overlapping the second emission area EA2, and a red (R) color filter 830 overlapping the third emission area EA3.

Figure 6:
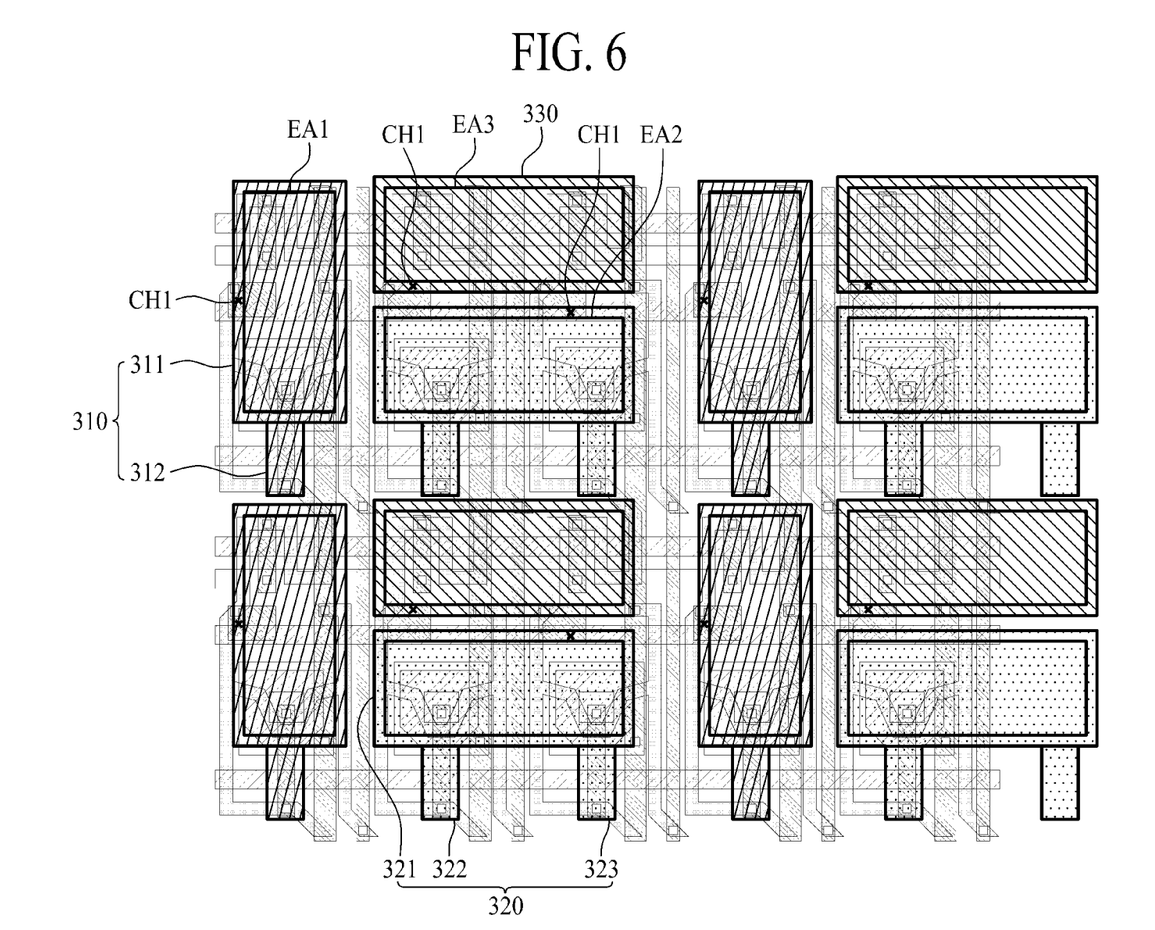
FIG. 6 is a plan view illustrating an example where an anode electrode is provided in each of a plurality of sub-pixels according to another embodiment of the present disclosure.

FIG. 6 is a plan view illustrating an example where an anode electrode is provided in each of a plurality of subpixels according to another embodiment of the present disclosure and illustrates an example where an anode electrode is provided in the plurality of unit circuits described above with reference to FIG. 3.

As seen in FIG. 6, a plurality of first anode electrodes 310, a plurality of second anode electrodes 320, and a plurality of third anode electrodes 330 may be spaced apart from one another by a certain interval. One first anode electrode 310 may be provided to overlap a first unit circuit C1 or a fourth unit circuit C4, and one second anode electrode 320 and one third anode electrode 330 may be provided to overlap a second unit circuit C2 and a third unit circuit C3. A long axis of the first anode electrode 310 may be arranged in a vertical direction, and a long axis of each of the second anode electrode 320 and the third anode electrode 330 may be arranged in a horizontal direction.

An edge of each of the first anode electrode 310, the second anode electrode 320, and the third anode electrode 330 may be covered by a bank, and regions which are not covered by the bank and are exposed may be a plurality of emission areas (for example, first to third emission areas) EA1 to EA3. The first emission area EA1 may be a blue emission area, the second emission area EA2 may be a green emission area, and the third emission area EA3 may be a red emission area.

Each of the first anode electrode 310, the second anode electrode 320, and the third anode electrode 330 may be electrically connected to a third connection electrode CE3 of a unit circuit (for example, C1, C2, or C3) corresponding thereto. For example, one first anode electrode 310 corresponding to a first unit circuit C1 may be electrically connected to a third connection electrode CE3 of the first unit circuit C1 through a first contact hole CH1, one second anode electrode 320 corresponding to a second unit circuit C2 may be electrically connected to a third connection electrode CE3 of the second unit circuit C2 through a first contact hole CH1, and one third anode electrode 330 corresponding to a third unit circuit C3 may be electrically connected to a third connection electrode CE3 of the third unit circuit C3 through a first contact hole CH1. In this case, each of the first anode electrode 310, the second anode electrode 320, and the third anode electrode 330 may overlap a third connection electrode CE3 of a unit circuit (for example, C1, C2, or C3) corresponding thereto.

One first anode electrode 310 corresponding to the first unit circuit C1 may include a first portion 311 and a second portion 312, so as to overlap a whole region of each of a first connection electrode CE1 and a gate electrode G of the first unit circuit C1. The first portion 311 may be a portion which overlaps a whole region of the first emission area EA1 and has a shape corresponding to the first emission area EA1, and the second portion 312 may be a portion which protrudes from the first portion 311 and overlaps the first connection electrode CE1 of the first unit circuit C1. The first portion 311 and the second portion 312 may include the same material and may be provided as one body.

One second anode electrode 320 corresponding to the second unit circuit C2 may include a first portion 321, a second portion 322, and a third portion 323, so as to overlap a whole region of each of a first connection electrode CE1 and a gate electrode G of the second unit circuit C2 and a whole region of each of a first connection electrode CE1 and a gate electrode G of the third unit circuit C3. The first portion 321 may be a portion which overlaps a whole region of the second emission area EA2 and has a shape corresponding to the second emission area EA2 and may overlap the gate electrode G of each of the second unit circuit C2 and the third unit circuit C3, the second portion 322 may be a portion which protrudes from the first portion 321 and overlaps the first connection electrode CE1 of the second unit circuit C2, and the third portion 323 may be a portion which protrudes from the first portion 321 and overlaps the first connection electrode CE1 of the third unit circuit C3. The first portion 321, the second portion 322, and the third portion 323 may include the same material and may be provided as one body.

One third anode electrode 330 corresponding to the third unit circuit C3 may overlap a whole region of the third emission area EA3 and has a shape corresponding to the third emission area EA3. Since the second anode electrode 330 overlaps a whole region of each of the first connection electrode CE1 and the gate electrode G of the third unit circuit C3, the third anode electrode 330 may not need a separate protrusion structure.

As described above, according to an embodiment of the present disclosure, in each of the plurality of unit circuits C1 to C3, a whole region of each of a first connection electrode CE1 and a gate electrode G of a seventh TFT T7 may overlap the anode electrodes 310 to 330, thereby preventing a luminance deviation of each subpixel.

Figure 7:
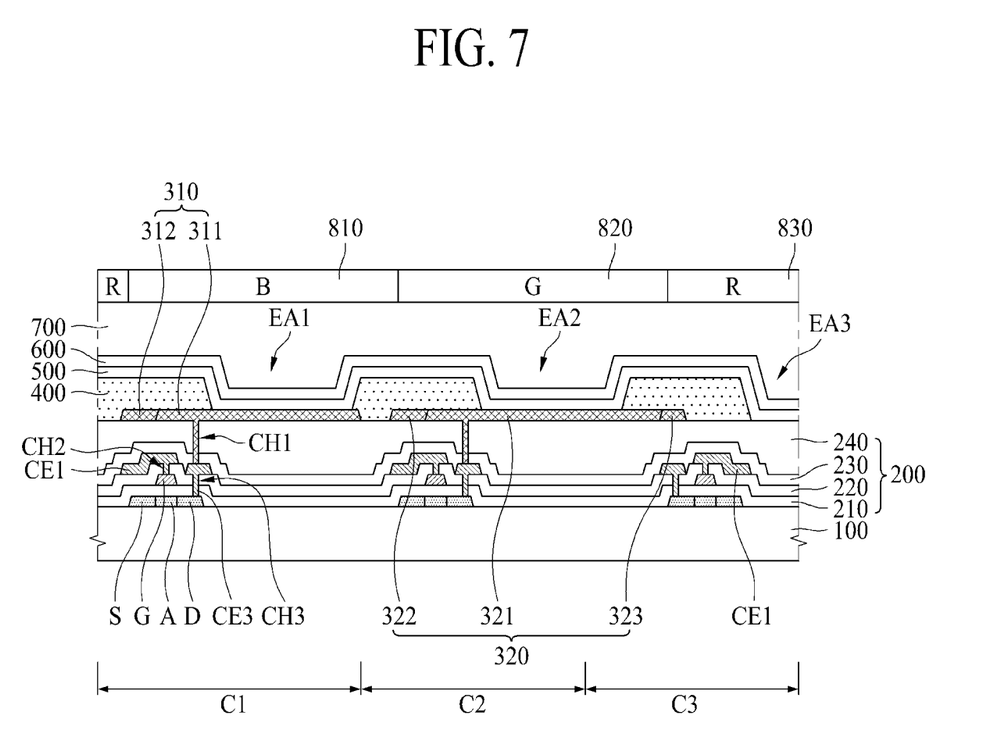
FIG. 7 is a cross-sectional view of an electroluminescent display apparatus according to another embodiment of the present disclosure and is a schematic cross-sectional view of first to third unit circuit regions of FIG. 6.

FIG. 7 is a cross-sectional view of an electroluminescent display apparatus according to another embodiment of the present disclosure and is a schematic cross-sectional view of first to third unit circuit C1 to C3 regions of FIG. 6.

As seen in FIG. 7, the electroluminescent display apparatus according to another embodiment of the present disclosure may include a substrate 100, a circuit device layer 200, a plurality of anode electrodes (for example, first and second anode electrodes) 310 and 320, a bank 400, a light emitting layer 500, a cathode electrode 600, an encapsulation layer 700, and a plurality of color filter layers 810 to 830.

Descriptions of the substrate 100, the circuit device layer 200, the bank 400, the light emitting layer 500, the cathode electrode 600, the encapsulation layer 700, and the color filter layers 810 to 830 are the same as descriptions given above with reference to FIG. 5, and thus, are omitted. Hereinafter, the anode electrodes 310 and 320 differing from FIG. 5 will be described.

The first anode electrode 310 may be provided to overlap a first unit circuit C1. A first portion 311 of the first anode electrode 310 may be connected to a third connection electrode CE3 of the first unit circuit C1 through a contact hole CH1. Also, the first portion 311 of the first anode electrode 310 may overlap a whole region of a gate electrode G of the first unit circuit C1, but may not overlap a portion of a first connection electrode CE1 of the first unit circuit C1. On the other hand, a second portion 312 of the first anode electrode 310 may overlap a portion of the first connection electrode CE1 of the first unit circuit C1.

The second anode electrode 320 may be provided to overlap the second unit circuit C2 and the third unit circuit C3.

A first portion 321 of the second anode electrode 320 may be connected to a third connection electrode CE3 of the second unit circuit C2 through a contact hole CH1. Also, the first portion 321 of the second anode electrode 320 may overlap a whole region of a gate electrode G of the second unit circuit C2 and a whole region of a gate electrode G of the third unit circuit C3. However, the first portion 321 of the second anode electrode 320 may not overlap a portion of a first connection electrode CE1 of the second unit circuit C2 and a portion of a first connection electrode CE1 of the third unit circuit C3. On the other hand, a second portion 312 of the second anode electrode 320 may overlap a portion of the first connection electrode CE1 of the second unit circuit C2, and a third portion 322 of the second anode electrode 320 may overlap a portion of the first connection electrode CE1 of the third unit circuit C3.

Hereinabove, an electroluminescent display apparatus where first to seventh TFTs T1 to T7 are provided in each of individual unit circuits C1 to C3 has been described, but the present disclosure is not limited thereto. For example, the present disclosure provides an electroluminescent display apparatus where three TFTs (for example, a driving TFT, a switching TFT, and a sensing TFT) are provided in each of individual unit circuits C1 to C3. In an electroluminescent display apparatus including three TFTs, a gate electrode of a driving TFT may be connected to a drain electrode of a switching TFT through a connection electrode, and thus, even in this case, a plurality of anode electrodes 310 to 330 may overlap the gate electrode of the driving TFT and the connection electrode.

As described above, according to the embodiments of the present disclosure, a gate electrode of a driving TFT may overlap an anode electrode of an organic light emitting device in each subpixel, thereby preventing a luminance deviation of each subpixel. Particularly, a connection electrode connected to the gate electrode of the driving TFT may overlap the anode electrode of the organic light emitting device, and thus, a luminance deviation of each subpixel may be more stably prevented.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An electroluminescent display apparatus comprising:
a plurality of unit circuits, each of the plurality of unit circuits including a connection electrode and a driving thin film transistor TFT, the connection electrode of each of the plurality of unit circuits electrically connected to a gate electrode of the driving TFT included in the unit circuit;
a plurality of anode electrodes, each of the plurality of anode electrodes connected to the driving TFT of a corresponding unit circuit of the plurality of unit circuits;
a bank covering an edge of each of the plurality of anode electrodes, the bank defining an emission area for each anode electrode;
a light emitting layer on each of the plurality of anode electrodes; and
a cathode electrode on the light emitting layer,
wherein each of the plurality of anode electrodes overlaps the gate electrode of the driving TFT and the connection electrode of a corresponding one of the plurality of unit circuits.

2. The electroluminescent display apparatus of claim 1, wherein the connection electrode electrically connects the gate electrode of the driving TFT to a drain electrode of another TFT.

3. The electroluminescent display apparatus of claim 1, wherein at least one anode electrode of the plurality of anode electrodes comprises a first portion and a second portion that protrudes from the first portion, the first portion having a shape corresponding to the emission area of the anode electrode, and wherein the second portion of the at least one anode electrode extends past the emission area of the at least one anode electrode and overlaps the connection electrode.

4. The electroluminescent display apparatus of claim 3, wherein the second portion overlaps the bank.

5. The electroluminescent display apparatus of claim 3, wherein the at least one anode electrode overlaps a plurality of unit circuits.

6. The electroluminescent display apparatus of claim 3, wherein
the at least one anode electrode further comprises a third portion protruding from the first portion, and
the third portion overlaps a gate electrode of another driving TFT that is not electrically connected to the at least one anode electrode, and a connection electrode that is connected to the gate electrode of the other driving TFT.

7. The electroluminescent display apparatus of claim 3, wherein another anode electrode of the plurality of anode electrodes overlaps a gate electrode of another driving TFT, and a connection electrode that is connected to the gate electrode of the other driving TFT, the other driving TFT electrically connected to the other anode electrode.

8. The electroluminescent display apparatus of claim 7, wherein
the other anode electrode comprises a first portion and a second portion that protrudes from the first portion, the first portion having a shape corresponding to the emission area of the other anode electrode, and
wherein the second portion of the other anode electrode extends past the emission area of the other anode electrode and overlaps the gate electrode of the other driving TFT and the connection electrode connected to the gate electrode of the other driving TFT, the other driving TFT electrically connected to the other anode electrode.

9. An electroluminescent display apparatus comprising:
a first unit circuit including a first driving thin film transistor (TFT) and a second unit circuit including) a second driving TFT;
a first anode electrode electrically connected to the first driving TFT of the first unit circuit;
a second anode electrode electrically connected to the second driving TFT of the second unit circuit;
a bank covering an edge of the first anode electrode and an edge of the second anode electrode, the bank defining a first emission area of the first anode electrode and a second emission area of the second anode electrode;
a light emitting layer on the first anode electrode and the second anode electrode; and
a cathode electrode on the light emitting layer,
wherein the first anode electrode and the first emission area overlap the first unit circuit and the second unit circuit, and the first anode electrode overlaps a gate electrode of the first driving TFT of the first unit circuit, but does not overlap a gate electrode of the second driving TFT of the second unit circuit.

10. The electroluminescent display apparatus of claim 9, wherein the gate electrode of the first driving TFT of the first unit circuit is electrically connected to a drain electrode of an additional TFT through a connection electrode, and
wherein the first anode electrode overlaps the connection electrode.

11. The electroluminescent display apparatus of claim 9, wherein
the first anode electrode comprises a first portion and a second portion that protrudes from the first portion, the first portion having a shape corresponding to the first emission area of the first anode electrode, and
wherein the second portion of the first anode electrode extends past the emission area of the first anode electrode and overlaps the gate electrode of the first driving TFT of the first unit circuit.

12. The electroluminescent display apparatus of claim 9, wherein the second anode electrode does not overlap a gate electrode of the second driving TFT of the second unit circuit.

13. The electroluminescent display apparatus of claim 12, wherein the first anode electrode overlaps the gate electrode of the second driving TFT of the second unit circuit.

14. An electroluminescent display apparatus comprising:
a first anode electrode provided in a first subpixel and a second anode electrode provided in a second subpixel;
a bank covering an edge of the first anode electrode and an edge of the second anode electrode, the bank defining a first emission area of the first anode electrode and a second emission area of the second anode electrode;
a light emitting layer on the first anode electrode and the second anode electrode; and
a cathode electrode on the light emitting layer,
wherein the first anode electrode has a shape corresponding to the first emission area, and the second anode electrode has a shape that does not correspond to the second emission area.

15. The electroluminescent display apparatus of claim 14, wherein the second anode electrode comprises a first portion and a second portion that protrudes from the first portion, the first portion of the second anode electrode having a shape corresponding to the second emission area of the second anode electrode, and the second portion of the second anode electrode extends past the second emission area of the second anode electrode.

16. The electroluminescent display apparatus of claim 15, further comprising a plurality of unit circuits provided under the first anode electrode and the second anode electrode, the plurality of unit circuits each including a connection electrode and a driving TFT, the connection electrode electrically connected to a gate electrode of the driving TFT,
wherein the second portion of the second anode electrode overlaps the gate electrode of the driving TFT and the connection electrode of a corresponding one of the plurality of unit circuits.

17. The electroluminescent display apparatus of claim 16, wherein the second anode electrode overlaps the plurality of unit circuits.

18. An electroluminescent display apparatus comprising:
a substrate;
a driving thin film transistor (TFT) on the substrate, the driving TFT comprising a gate electrode;
a connection electrode electrically connected to the gate electrode of the driving TFT, the connection electrode electrically connecting the gate electrode of the driving TFT to a drain electrode of another TFT;
an anode electrode on the driving TFT, the anode electrode overlapping both the gate electrode of the driving TFT and the connection electrode;
a light emitting layer on the anode electrode, the light emitting layer configured to emit light; and
a cathode on the light emitting layer.

19. The electroluminescent display apparatus of claim 18, wherein the anode electrode overlaps the gate electrode of the driving TFT entirely and overlaps the connection electrode entirely.

20. The electroluminescent display apparatus of claim 18, wherein the anode electrode comprises:
a first portion that overlaps an emission area of a subpixel that includes the anode electrode, but does not overlap the gate electrode and the connection electrode, the first portion electrically connected to the driving TFT,
a second portion protruding from the first portion of the anode electrode, the second portion of the anode electrode completely overlapping both the connection electrode and the gate electrode of the driving TFT, but does not overlap the emission area of the subpixel.

21. The electroluminescent display apparatus of claim 20, further comprising:
a bank on the anode electrode, the bank defining the emission area of the subpixel, wherein the bank at least partially overlaps the second portion of the anode electrode.

22. The electroluminescent display of claim 20, wherein the first portion of the anode electrode and the second portion of the anode electrode comprise a same material and are provided as a single body.

23. The electroluminescent display of claim 20, wherein the first portion of the anode electrode has a shape corresponding to a shape of the emission area, and the second portion of the anode electrode has a shape that does not correspond to the shape of the emission area.

* * * * *